US012635364B2

(12) United States Patent
Im

(10) Patent No.: US 12,635,364 B2
(45) Date of Patent: May 19, 2026

(54) DISPLAY APPARATUS

(71) Applicant: LG Display Co., Ltd., Seoul (KR)

(72) Inventor: Seoyeon Im, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 391 days.

(21) Appl. No.: 18/196,811

(22) Filed: May 12, 2023

(65) Prior Publication Data

US 2024/0049526 A1 Feb. 8, 2024

(30) Foreign Application Priority Data

Aug. 8, 2022 (KR) ........................ 10-2022-0098830

(51) Int. Cl.
 H10K 59/126 (2023.01)
 H10K 59/80 (2023.01)
(52) U.S. Cl.
 CPC ....... H10K 59/126 (2023.02); H10K 59/8792 (2023.02)
(58) Field of Classification Search
 None
 See application file for complete search history.

(56) References Cited

U.S. PATENT DOCUMENTS

| | | | | |
|---|---|---|---|---|
| 2017/0373094 A1* | 12/2017 | Park | ................... | H10D 86/0231 |
| 2020/0286972 A1* | 9/2020 | Seo | ...................... | G09G 3/3266 |
| 2021/0013280 A1* | 1/2021 | Choi | .................... | H10K 59/123 |
| 2021/0036029 A1* | 2/2021 | Park | ...................... | H10D 86/431 |
| 2021/0104558 A1* | 4/2021 | Kim | .................. | H10D 30/6731 |

FOREIGN PATENT DOCUMENTS

| | | |
|---|---|---|
| KR | 10-2016-0056390 A | 5/2016 |
| KR | 10-2019-0061823 A | 6/2019 |
| KR | 10-2021-0077279 A | 6/2021 |

OTHER PUBLICATIONS

Ministry of Intellectual Property of Korea, Office Action, Korean Patent Application No. 10-2022-0098830, Jan. 7, 2026, 19 pages.

* cited by examiner

*Primary Examiner* — Khaja Ahmad
(74) *Attorney, Agent, or Firm* — Fenwick & West LLP

(57) ABSTRACT

A display apparatus includes a substrate including a display area and a non-display area at a periphery of the display area and a subpixel in the display area, wherein the subpixel includes a light emitting device layer including a first electrode, an emission layer, and a second electrode, a driving thin film transistor (TFT) connected to the first electrode, a switching TFT connected between a gate electrode and a drain electrode of the driving TFT, and a degradation prevention layer overlapping the switching TFT.

27 Claims, 8 Drawing Sheets

390 : 391
321 : 321a, 321b, 321c

390 : 392
321 : 321a, 321b, 321c

390 : 391, 392, 393, 394, 395
321 : 321a, 321b, 321c

DISPLAY APPARATUS

CROSS-REFERENCE TO RELATED APPLICATION

This application claims the benefit and priority to the Republic of Korea Patent Application No. 10-2022-0098830 filed on Aug. 8, 2022, which is hereby incorporated by reference in its entirety.

BACKGROUND

Technical Field

The present disclosure relates to a display apparatus.

Discussion of the Related Art

Display apparatuses, such as liquid crystal display (LCD) apparatuses and organic light emitting display apparatuses, include a display panel and is thin, lightweight and has low power consumption.

The display panel may include a plurality of gate lines and a plurality of data lines, and a gate line and a data line may intersect with each other to define a pixel area. The pixel area may include one or more thin film transistors (TFTs), and a TFT may adjust a level of a current or a voltage applied to an organic light emitting diode (OLED) or liquid crystal molecules for each pixel area to control the amount of light emitted from the pixel area.

Based on a material of a semiconductor included in the TFTs, the TFTs may be categorized into an amorphous silicon TFT (a-Si TFT), a polycrystalline silicon TFT (poly-Si TFT), and an oxide TFT.

The oxide TFT may be used in high-performance display apparatuses because electron mobility thereof is higher than that of an a-Si TFT.

SUMMARY

However, it is newly recognized by the inventor of the present disclosure that, because the oxide TFT and lines connected thereto have a high light reflectance in metal characteristic, the oxide TFT may be degraded by the reflection of external light incident from the outside of the display panel.

Accordingly, the present disclosure may provide a display apparatus that substantially obviates one or more problems due to limitations and disadvantages of the related art.

An aspect of the present disclosure may provide a display apparatus for decreasing a degradation in a thin film transistor (TFT) caused by internal reflected light based on external light.

To achieve these and other aspects of the inventive concepts, as embodied and broadly described herein, a display apparatus includes a substrate including a display area, and a subpixel provided in the display area, wherein the subpixel includes a light emitting device layer, a driving thin film transistor (TFT) connected with the light emitting device layer, a switching TFT connected between a gate electrode and a drain electrode of the driving TFT, and a degradation prevention layer overlapping the switching TFT.

Other systems, methods, features and advantages will be, or will become, apparent to one with skill in the art upon examination of the following figures and detailed description, or may be learned by practice of the inventive concepts provided herein. Other features and aspects of the inventive concepts may be realized and attained by the structures pointed out in the present disclosure, or derivable therefrom, and the claims hereof as well as the appended drawings. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

A display apparatus according to the present disclosure may include a degradation prevention layer, and thus, may decrease a degradation in a TFT caused by internal reflected light based on external light.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which may be included to provide a further understanding of the disclosure and may be incorporated in and constitute a part of the present disclosure, illustrate embodiments of the disclosure and together with the description serve to explain various principles of the disclosure. In the drawings.

Figure 1:
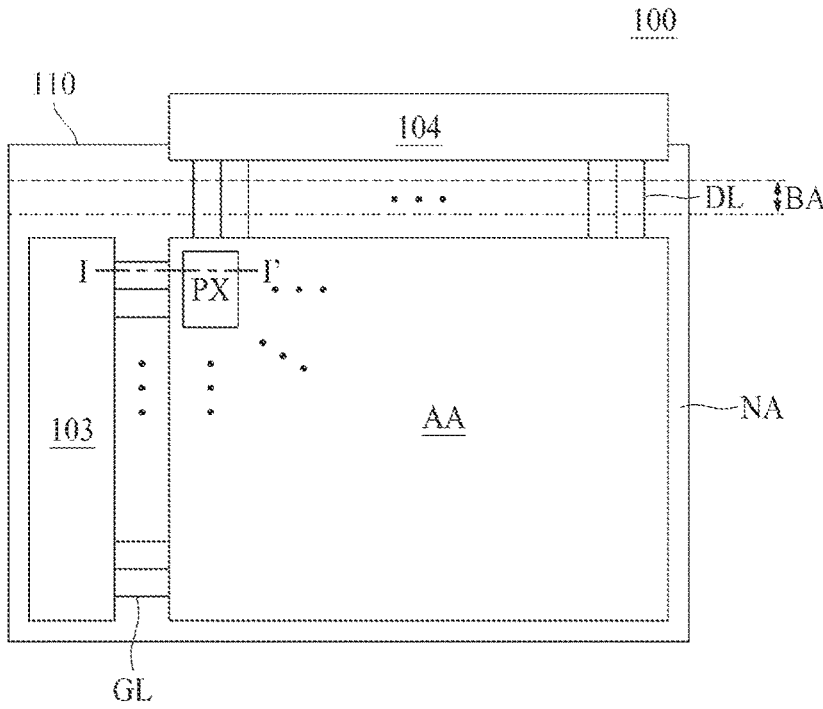
FIG. 1 is a diagram illustrating a display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted for brevity. The progression, sequence or order of processing steps and/or operations described is an example; however, the sequence of steps and/or operations is not limited to that set forth herein and may be changed, with the exception of steps and/or operations necessarily occurring in a particular order.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

The shapes, sizes, areas, ratios, angles, numbers, and the like disclosed in the drawings for describing embodiments of the present disclosure are merely examples, and thus, the present disclosure is not limited to the illustrated details.

When the term "comprise," "have," "include," "contain," "constitute," "make up of," "formed of," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise, and vice versa. The word "exemplary" is used to mean serving as an example or illustration. Embodiments are example embodiments. Aspects are example aspects. Any implementation described herein as an "example" is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). Further, the term "may" encompasses all the meanings of the term "can."

In describing a positional relationship, where the positional relationship between two parts is described, for example, using "on," "over," "under," "above," "below," "beneath," "near," "close to," or "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It is understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms "first," "second," and the like may be used to distinguish components from each other, but the functions or structures of the components are not limited by ordinal numbers or component names in front of the components.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of elements.

For the expression that an element or layer is "connected," "coupled," or "adhered" to another element or layer the element or layer can not only be directly connected, coupled, or adhered to another element or layer, but also be indirectly connected, coupled, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

Features of various embodiments of the present disclosure may be partially or overall coupled to or combined with each other, and may be variously inter-operated, linked or driven together. The embodiments of the present disclosure may be carried out independently from each other or may be carried out together in co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

Hereinafter, embodiments of a display apparatus according to various example embodiments of the present disclosure will be described in detail with reference to the accompanying drawings. With respect to reference numerals to elements of each of the drawings, although the same elements may be illustrated in other drawings, like reference numerals may refer to like elements unless stated otherwise. In addition, for convenience of description, a scale, dimension, size, and thickness of each of the elements illustrated in the accompanying drawings may differ from an actual scale, dimension, size, and thickness, and thus, embodiments of the present disclosure are not limited to a scale, dimension, size, and thickness illustrated in the drawings.

FIG. 1 is a diagram illustrating a display apparatus according to an embodiment of the present disclosure.

Referring to FIG. 1, a display apparatus 100 according to an embodiment of the present disclosure may include a display panel 110. The display panel 110 may include a display area AA where a plurality of subpixels PX are provided and a non-display area NA which is disposed at a periphery of the display area AA.

The subpixel PX of the display area AA may include a thin film transistor (TFT) which uses an oxide semiconductor material as an active layer. For example, the oxide semiconductor material may be formed of any one of indium gallium zinc oxide (IGZO), indium zinc oxide (IZO), indium gallium tin oxide (IGTO), and indium gallium oxide (IGO), but is not limited thereto.

A plurality of data lines DL and a plurality of gate lines GL may be arranged in the display area AA. For example, the plurality of data lines DL may be arranged in rows or columns, and the plurality of gate lines GL may be arranged in columns or rows. Also, the subpixel PX may be provided in an area defined by the data line DL and the gate line GL.

The plurality of gate lines GL may include a plurality of scan lines and a plurality of emission control lines. The plurality of scan lines and the plurality of emission control lines may transfer different kinds of gate signals (for example, a scan signal and an emission control signal) to gate nodes of different kinds of transistors (for example, a scan transistor and an emission control transistor) disposed in the subpixel PX.

One of a data driver 104 and a gate driver 103 may be disposed in the non-display area NA. Also, the non-display area NA may further a bending region BA where a substrate of the display panel 110 may be bent, but embodiments of the present disclosure are not limited thereto. For example, the bending region BA may be provided in the non-display area NA.

The gate driver 103 may include a TFT which is directly formed on the substrate of the display panel 110. For example, the gate driver 103 may include a TFT including a polycrystalline silicon semiconductor layer, a TFT including an oxide semiconductor layer, or the TFT including the polycrystalline silicon semiconductor layer and the TFT including the oxide semiconductor layer, which are paired. In a case where TFTs respectively disposed in the non-display area NA and the display area AA include the same semiconductor material, the forming of TFTs respectively disposed in the non-display area NA and the display area AA may be simultaneously performed in the same process.

In the TFT including the polycrystalline silicon semiconductor layer and the TFT including the oxide semiconductor layer, electron mobility may be high in a channel, and thus, a high resolution and low power may be implemented.

The gate driver 103 may supply a scan signal having a gate-on voltage to the plurality of gate lines GL sequentially or in a predetermined order, and thus, may drive pixel rows of the display area AA sequentially or in a predetermined order. Here, the gate driver 103 may be referred to as a scan driver. Here, the pixel row may denote a row which is configured with pixels connected to one gate line. As in the display apparatus according to an embodiment of the present disclosure, the gate driver 103 may be implemented as a gate in panel (GIP) type and may be directly disposed on the substrate of the display panel 110. Alternatively, the gate driver 103 can be integrated and arranged on the display panel 100, or each gate driver 103 can be implemented by a chip-on-film (COF) method in which an element is mounted on a film connected to the display panel 110. The gate driver 103 may include a shift register and a level shifter.

The gate driver 103 may include a scan driving circuit which outputs scan signals to a plurality of scan lines corresponding to one kind of the gate line GL and an emission driving circuit which outputs emission control signals to the plurality of emission control lines corresponding to the other kind of the gate line GL.

The display apparatus 100 according to an embodiment of the present disclosure may further include the data driver 104. Also, the data driver 104 may convert image data into analog data voltages, and when a specific gate line is driven by the gate driver 103, the data driver 104 may supply the data voltages to the plurality of data lines DL according to the timing at which the scan signal is applied through the gate lines. The data lines DL may be connected with the data driver 104 through a data pad. Although the data driver 104 is shown as being disposed on one side of the display panel 100 in FIG. 1, the number and position of the data driver 104 are not limited thereto.

The data line DL may be disposed to pass through the bending region BA, and various data lines DL may be disposed and may be connected with the data driver 104 through a data pad.

The bending region BA may be a region where the substrate of the display panel 110 may be bent. The substrate of the display panel 110 may maintain a flat state in a region except the bending region BA.

Figure 2:
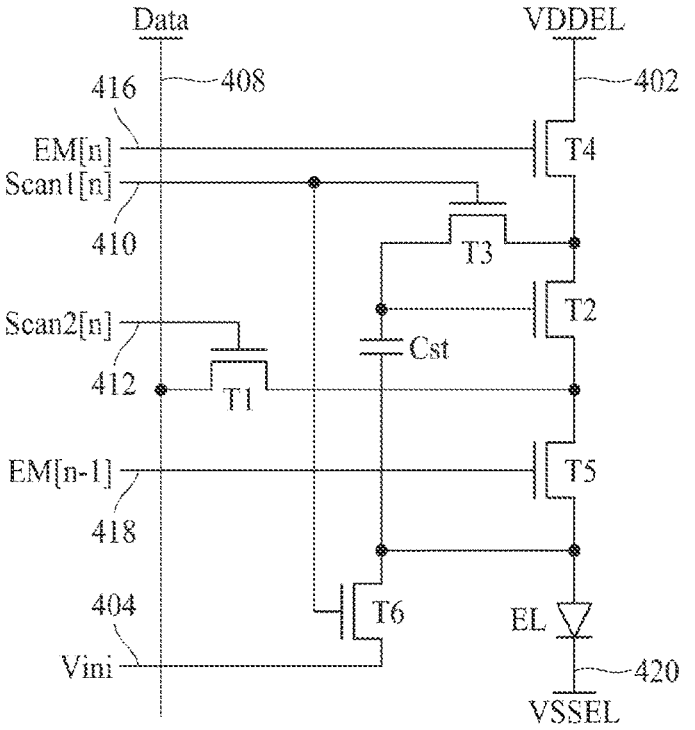
FIG. 2 is a circuit diagram illustrating a pixel driving circuit of a display apparatus according to an embodiment of the present disclosure.

FIG. 2 is a circuit diagram illustrating a pixel driving circuit of a display apparatus according to an example embodiment of the present disclosure. FIG. 2 illustrates a pixel driving circuit provided in one subpixel illustrated in FIG. 1.

Referring to FIG. 2, in a display apparatus according to an example embodiment of the present disclosure, the pixel driving circuit (or a pixel circuit) may include six TFTs T1 to T6 and one storage capacitor Cst. Here, one of the six TFTs T1 to T6 may be a driving TFT T2, and the other TFTs may be switching TFTs T1 and T3 to T6 for compensating for a characteristic (for example, a threshold voltage and/or mobility) of a TFT (e.g., the driving TFT T2), but embodiments of the present disclosure are not limited thereto.

A first switching TFT T1 may be turned on by a second scan signal Scan2[n] supplied to a second gate line 412 and may transfer a data voltage Vdata, supplied through a data line 408, to a first electrode (a source or a drain electrode) of a driving TFT T2 and a second electrode (a drain or a source electrode) of a fifth switching TFT T5.

A third switching TFT T3 may be turned on by a first scan signal Scan1[n] supplied to a first gate line 410 and may connect a gate electrode and a second electrode (a drain or a source electrode) of the driving TFT T2 with each other such that the driving TFT T2 is connected in a diode structure. Here, the third switching TFT T3 may operate during a sampling period where a threshold voltage Vth of the driving TFT T2 is stored in the capacitor Cst.

Therefore, because the third switching TFT T3 affects a gate voltage of the driving TFT T2 during the sampling period, a threshold voltage Vth of the third switching TFT T3 may change the gate voltage of the driving TFT T2. Therefore, during the sampling period, a compensation voltage corresponding to the threshold voltage Vth of the driving TFT T2 stored in the capacitor may be affected by the threshold voltage Vth of the third switching TFT T3. When the third switching TFT T3 includes an oxide semiconductor layer, the threshold voltage Vth of the third switching TFT T3 may be degraded or changed by internal reflected light based on external light, and thus, the amount of current flowing in the driving TFT T2 may be changed by the threshold voltage Vth of the third switching TFT T3 and the luminance of a light emitting device layer EL emitting light with a current flowing in the driving TFT T2 may be changed. Accordingly, the amount of current flowing in the driving TFT T2 or the luminance of the light emitting device layer EL may be largely changed or sensitively changed by the threshold voltage Vth of the third switching TFT T3.

A fourth switching TFT T4 may be turned on by an emission control signal EM[n] supplied to a first emission control line 416 and may transfer a first source voltage VDDEL, supplied through a first power line 402, to a source electrode of the driving TFT T2.

A fifth switching TFT T5 may be turned on by an emission control signal EM[n−1] supplied to a second emission control line 418 and may electrically connect a drain electrode of the driving TFT T2 to an anode electrode of the light emitting device layer EL.

A sixth switching TFT T6 may be turned on by the first scan signal Scan1[n] supplied to the first gate line 410 and may transfer an initialization voltage Vini, supplied through an initialization voltage line 404, to a drain electrode of the fifth switching TFT T5.

The storage capacitor Cst may be connected between the gate electrode of the driving TFT T2 and a drain electrode of the sixth switching TFT T6 and may be charged with a difference voltage between a high level source voltage VDDEL and a data voltage "Vdata+Vth" which is obtained by compensating for the threshold voltage Vth of the driving TFT T2 and may supply a charged voltage as a driving voltage of the driving TFT T2.

The driving TFT T2 may control a current flowing to the light emitting device layer EL through the fifth switching TFT T5, based on the driving voltage charged into the storage capacitor Cst, and thus, may control the emission strength of the light emitting device layer EL.

The light emitting device layer EL may include an anode connected with the source (or drain) electrode of the driving TFT T2 through the fifth switching TFT T5, a cathode connected with a second power line 420 through which a second source voltage VSSEL is supplied, and an organic emission layer between the anode and the cathode. However, the present disclosure is not limited thereto. For example, the light emitting device layer EL may also be implemented as an inorganic light emitting device layer such as micro-LED.

For example, in the present disclosure, the driving TFT T2 may include an oxide semiconductor layer. Also, the third switching TFT T3 of the switching TFTs electrically connected with the driving TFT T2 may include an oxide semiconductor layer. Furthermore, at least one of the other switching TFTs T1 and T4 to T6 for internal compensation may include a polycrystalline silicon semiconductor layer. However, the present disclosure is not limited thereto. For example, one or more of the other switching TFTs T1 and T4 to T6 may include an oxide semiconductor layer.

It is to be noted that although the embodiment of FIG. 2 discloses a specific structure of the pixel driving circuit as an example, the present disclosure is not limited thereto. For example, the pixel driving circuit of the display apparatus may have various other structures. For example, 3T1C, 4T1C, 5T1C, 3T2C, 4T2C, 5T2C, 6T2C, 7T1C, 7T2C, 8T2C and the like structures are also possible, and more or less transistors and capacitors could be included.

Figure 3:
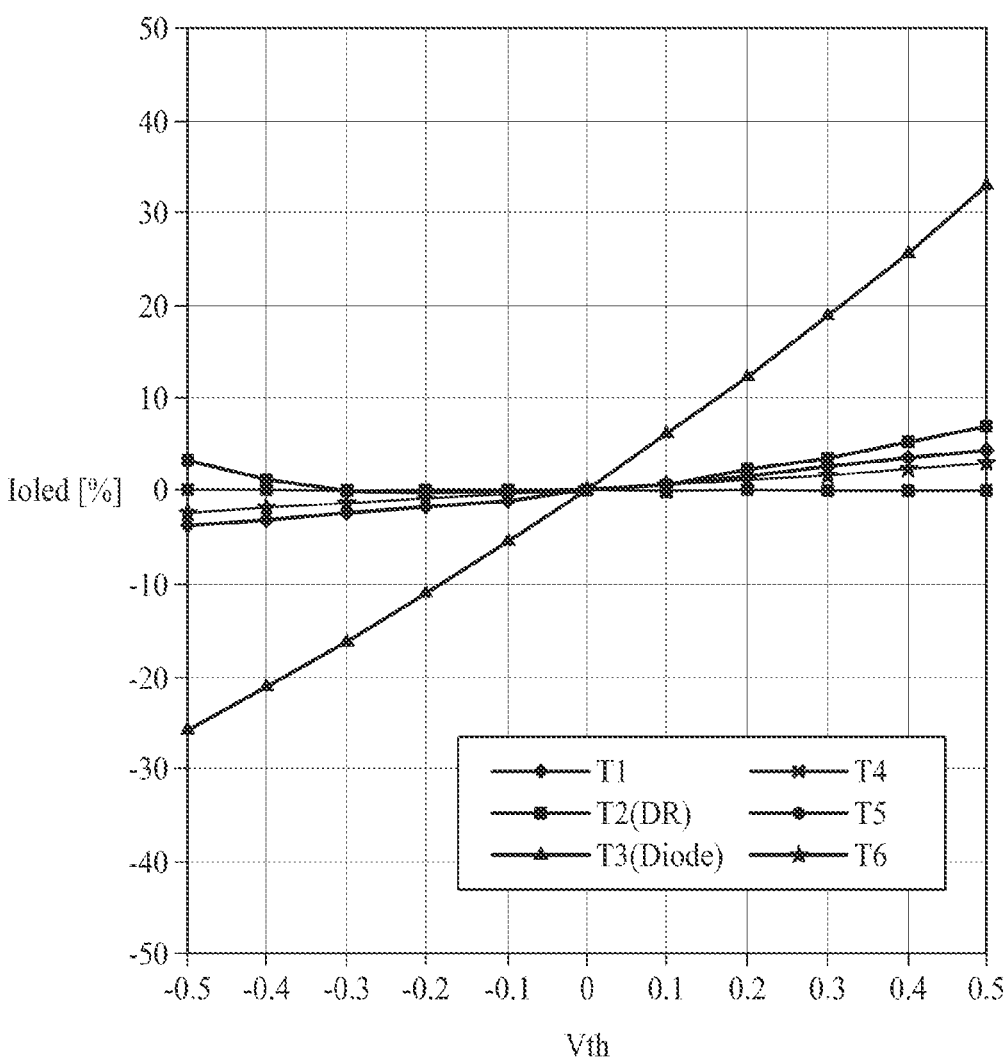
FIG. 3 is a diagram showing the amount of variation of a current flowing in a light emitting device with respect to a variation of a threshold voltage of each of TFTs configuring a pixel driving circuit, in a display apparatus according to an embodiment of the present disclosure.

FIG. 3 is a diagram showing the amount of variation of a current flowing in a light emitting device with respect to a variation of a threshold voltage of each of TFTs configuring a pixel driving circuit, in a display apparatus according to an example embodiment of the present disclosure. FIG. 3 is a diagram showing luminance sensitivity with respect to a threshold voltage Vth of each of TFTs through a variation of a current Ioled flowing in a light emitting device, based on a variation of the threshold voltage Vth caused by the light degradation of TFTs configuring a pixel driving circuit. Here, in FIG. 3, a simulation condition (1H)=3.2 u, sampling time=2.4 u, driving TFT=1 V (5.0 u/5.0 u), threshold voltage (Vth)=1 V, and sub threshold swing=0.3, and Ion5=1.35.

Referring to FIG. 3, it may be seen that the amount of variation (ΔIoled) of a current flowing in a light emitting device caused by a variation of a threshold voltage Vth of each of TFTs is largely changed based on a variation of a third switching TFT T3, compared to the other TFTs T1, T2, T4, T5, and T6.

To confirm this, the inventors have measured the amount of variation (ΔIoled) of a current flowing in a light emitting device caused by a variation of a threshold voltage Vth, caused by light degradation, of each of the driving TFT T2, the first switching TFT T1, and the third to sixth switching TFTs T3 to T6.

As a result, it may be seen that the amount of variation (ΔIoled) of a current flowing in a light emitting device, caused by a variation of a threshold voltage Vth, caused by light degradation, of each of the driving TFT T2, the first switching TFT T1, and the fourth to sixth switching TFTs T4 to T6, is not largely changed.

On the other hand, it may be seen that the amount of variation (ΔIoled) of a current flowing in a light emitting device is largely changed based on a variation of a threshold voltage Vth of the third switching TFT T3. Particularly, the amount of variation (ΔIoled) of a current flowing in the light emitting device may increase or decrease in proportion to the variation of the threshold voltage Vth of the third switching TFT T3.

Therefore, the inventors have confirmed that luminance sensitivity, based on the variation of the threshold voltage Vth of the third switching TFT T3 connecting a gate electrode and a drain electrode of the driving TFT T2 with each other such that the driving TFT T2 is connected in a diode structure, is high.

Accordingly, in an embodiment of the present disclosure, a degradation prevention layer has been selectively applied to the third switching TFT T3 having high luminance sensitivity, and the light degradation of the third switching TFT T3 caused by internal reflected light has been considerably reduced.

Figure 4:
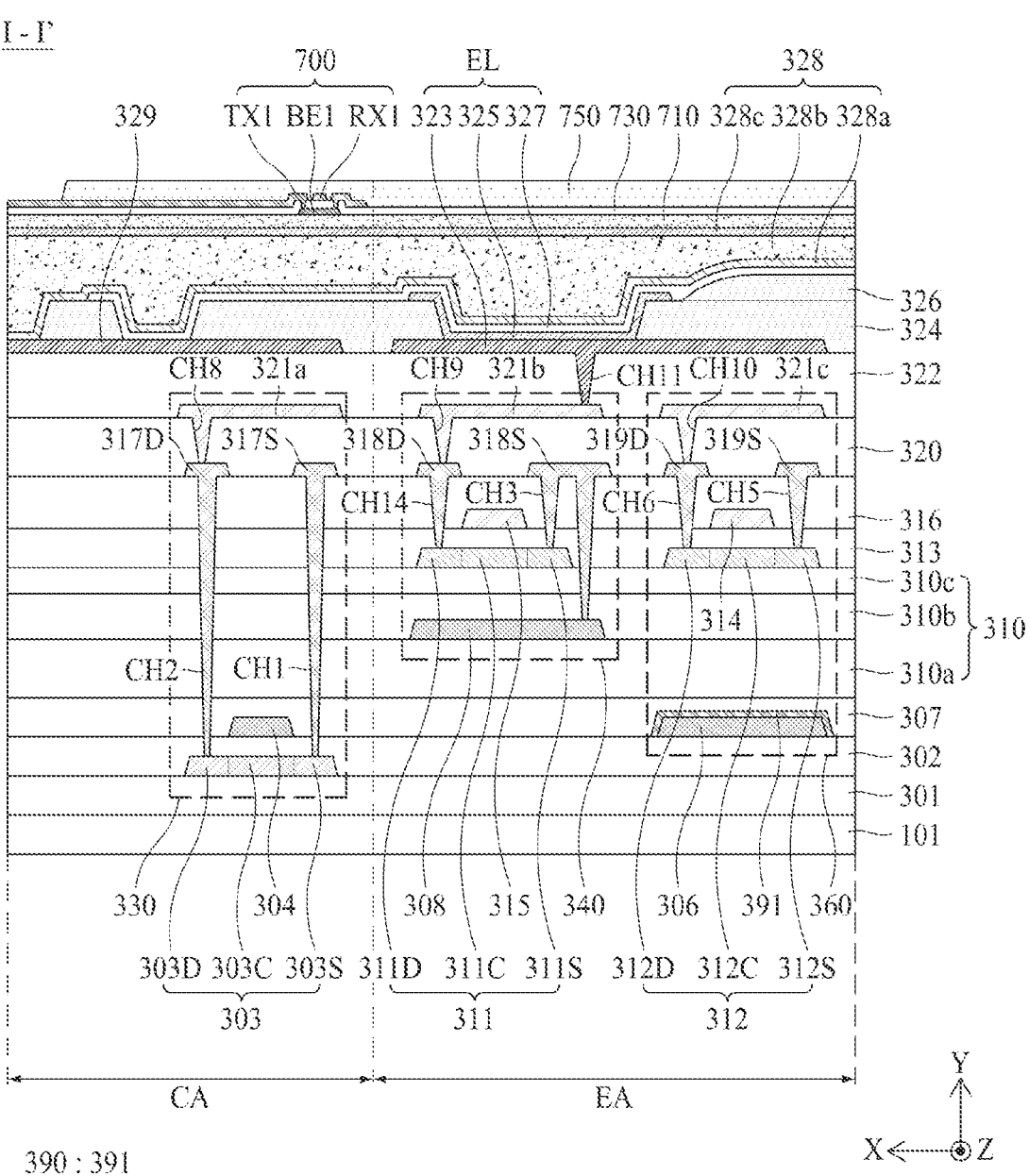
FIG. 4 is a cross-sectional view along line I-I' of the display apparatus according to an embodiment of the present disclosure.

FIG. 4 is a cross-sectional view of the display apparatus according to an example embodiment of the present disclosure. For example, FIG. 4 is a cross-sectional view of the display apparatus taken along a line I-I' of FIG. 1.

Referring to FIG. 4, a display apparatus according to an embodiment of the present disclosure may include a substrate 101 and a pixel or subpixel PX. The substrate 101 may include a display area AA and a non-display area NA which is disposed at a periphery of the display area AA, and the subpixel PX may be disposed in the display area AA of the substrate 101.

One subpixel PX may include a driving circuit TFT 330, a driving TFT 340, a switching TFT 360, a degradation prevention layer 390, and a light emitting device layer EL, which are provided on the substrate 101 and are disposed in the display area AA. For example, the driving TFT 340 and one or more switching TFTs 360 according to an embodiment of the present disclosure may include an oxide semiconductor layer. A TFT using the oxide semiconductor layer may be good in effect of blocking a leakage current and is relatively lower in manufacturing cost than a TFT including a polycrystalline silicon semiconductor layer. As shown in FIG. 4, the driving circuit TFT 330 is disposed in a circuit area (CA) of the display area AA, and the driving TFT 340 and the switching TFT 360 may be disposed in an emission area (EA) of the display area AA, but the present disclosure is not limited thereto.

In detail, the display apparatus according to an embodiment of the present disclosure may include a substrate 101, a lower buffer layer 301, a driving circuit TFT 330, a driving TFT 340, a switching TFT 360, a degradation prevention layer 390, a first planarization layer 320, a connection electrode 321, a second planarization layer 322, a light emitting device layer EL, an encapsulation layer 328, a touch buffer layer 710, and a touch sensor layer 700.

The substrate 101 may be formed of a multilayer where an organic layer and an inorganic layer are alternately stacked. For example, the substrate 101 may be formed by alternately stacking an organic layer such as polyimide and an inorganic layer such as silicon oxide (SiOx). As another example, the substrate 101 may include a plastic material having flexibility so as to enable bending. For example, the substrate 101 may include a material such as polyimide (PI), polyethylene terephthalate (PET), polyethylene naphthalate (PEN), polycarbonate (PC), polyethersulfone (PES), polyarylate (PAR), polysulfone (PSF), or cyclic-olefin copolymer (COC).

The lower buffer layer 301 may be provided on the substrate 101. The lower buffer layer 301 may be used for preventing or at least reducing the penetration of water from the outside. For example, the lower buffer layer 301 may include one or more SiOx layers. As another example, the lower buffer layer 301 may have a stack structure where one or more amorphous silicon (a-Si), one or more SiOx layers and one or more silicon nitride (SiNx) layers are alternately stacked, but embodiments are not limited thereto.

The driving circuit TFT 330 may be provided on the lower buffer layer 301. For example, the driving circuit TFT 330 may use a polycrystalline silicon semiconductor pattern as an active layer. The driving circuit TFT 330 may include a first active layer 303, a lower gate insulation layer 302, a first lower gate electrode 304, a lower interlayer insulation layer 307, an upper buffer layer 310, an upper gate insulation layer 313, an upper interlayer insulation layer 316, a first source electrode 317S, and a first drain electrode 317D.

The first active layer 303 may include a polycrystalline silicon semiconductor material. The first active layer 303 may include a first channel region 303C provided at a center thereof, and a first source region 303S and a first drain region 303D which are disposed with the first channel region 303C therebetween.

The first channel region 303C may be a region where the polycrystalline silicon semiconductor material maintains an intrinsic state and may provide a path through which an electron or a hole moves.

The first source region 303S and the first drain region 303D may be a region which has conductivity by doping Group 5 or 3 impurity ions on an intrinsic polycrystalline silicon semiconductor at a certain concentration. For example, the impurity ion may be phosphorous (P) or boron (B).

The lower gate insulation layer 302 may be provided on the first active layer 303. For example, the lower gate insulation layer 302 may be an inorganic layer. For example, the lower gate insulation layer 302 may include SiOx or SiNx.

The first lower gate electrode 304 may be provided on the lower gate insulation layer 302. The first lower gate electrode 304 may overlap the first channel region 303C of the first active layer 303. For example, the first lower gate electrode 304 may include a metal material. For example, the first lower gate electrode 304 may include a single layer or a multilayer, which includes one of molybdenum (Mo), aluminum (Al), chromium (Cr), gold (Au), titanium (Ti), nickel (Ni), neodymium (Nd), and copper (Cu), or an alloy thereof. However, the materials of the first lower gate electrode 304 are not limited thereto.

In an embodiment of the present disclosure, the driving circuit TFT 330 may be a top gate type where the first lower gate electrode 304 is disposed on the first active layer 303. However, the present disclosure is not limited thereto. For example, the driving circuit TFT 330 may be a bottom gate type or a dual gate type.

The lower interlayer insulation layer 307 may be provided on the first lower gate electrode 304. The lower interlayer insulation layer 307 may include SiNx. For example, the lower interlayer insulation layer 307 may include a hydrogen particle. When a thermal treatment process is performed after forming the first active layer 303 and depositing the lower interlayer insulation layer 307 thereon, the hydrogen particle included in the lower interlay insulation layer 307 may penetrate into the first source region 303S and the first drain region 303D to fill voids in the first active layer 303 with hydrogen, thereby enhancing and stabilizing a conductance of a polycrystalline silicon semiconductor material.

The upper buffer layer 310 may be provided on the lower interlayer insulation layer 307. The upper buffer layer 310 may separate the first active layer 303 including a polycrystalline silicon semiconductor material from a third active layer 312 of the third switching TFT 360 and a second active layer 311 of the driving TFT 340 including an oxide semiconductor material. For example, the upper buffer layer 310 may include SiOx layer and SiNx layer which are alternately stacked.

The upper gate insulation layer 313 may be provided on the upper buffer layer 310. For example, the upper gate insulation layer 313 may include an inorganic layer. For example, the upper gate insulation layer 313 may include SiOx or SiNx.

The upper interlayer insulation layer 316 may be provided on the upper gate insulation layer 313. The upper interlayer insulation layer 316 may cover a first upper gate electrode 315 of the driving TFT 340 and a second upper gate electrode 314 of the switching TFT 360. For example, the upper interlayer insulation layer 316 may be provided on the second active layer 311 and the third active layer 312 including an oxide semiconductor material, and may be formed of an inorganic layer including no hydrogen particle. Accordingly, the diffusion of the hydrogen particle from the upper interlayer insulation layer 316 into the second active layer 311 and the third active layer 312 can be reduced or prevented, and thus damage to the second active layer 311 and the third active layer 312 can be reduced or prevented and reliability can be improved.

The first source electrode 317S and the first drain electrode 317D may be provided on the upper interlayer insulation layer 316. The first source electrode 317S and the first drain electrode 317D may be connected with the first active layer 303. The first source electrode 317S and the first drain electrode 317D may be respectively connected with the first source region 303S and the first drain region 303D through a first contact hole CH1 and a second contact hole CH2. The first contact hole CH1 and the second contact hole CH2 may be formed to pass through the upper interlayer insulation layer 316, the upper gate insulation layer 313, the upper buffer layer 310, the lower interlayer insulation layer 307, and the lower gate insulation layer 302. For example, the first source electrode 317S and the first drain electrode 317D may include a single layer or a multilayer, which includes one of Mo, Al, Cr, Au, Ti, Ni, Nd, and Cu, or an alloy thereof.

The driving TFT 340 may be provided on the upper buffer layer 310. The driving TFT 340 may include a second active layer 311, an upper gate insulation layer 313, a first upper gate electrode 315, the upper interlayer insulation layer 316, a second source electrode 318S, a second drain electrode 318D, and a light blocking layer 308.

The second active layer 311 may be provided on the upper buffer layer 310. The second active layer 311 may include an oxide semiconductor. The second active layer 311 may include an intrinsic second channel region 311C which is not doped, and a second source region 311S and a second drain region 311D which have conductivity by doping impurities. The second source region 311S and the second drain region 311D may be disposed with the second channel region 311C therebetween.

The upper gate insulation layer 313 may be provided on the second active layer 311. The upper gate insulation layer 313 may be provided between the second active layer 311 and the first upper gate electrode 315. The upper gate insulation layer 313 may be provided to cover the second active layer 311.

The first upper gate electrode 315 may be provided on the upper gate insulation layer 313. The first upper gate electrode 315 may overlap the second active layer 311. The first upper gate electrode 315 may overlap and may have the same width as the second channel region 311C of the second active layer 311. For example, the first upper gate electrode 315 may include the same metal material as that of the first lower gate electrode 304. For example, the first upper gate electrode 315 may include a single layer or a multilayer, which includes one of Mo, Al, Cr, Au, Ti, Ni, Nd, and Cu, or an alloy thereof.

The upper interlayer insulation layer 316 may be provided on the first upper gate electrode 315. The upper interlayer insulation layer 316 may be formed to cover the first upper gate electrode 315. For example, the upper interlayer insulation layer 316 may include SiNx.

The second source electrode 318S and the second drain electrode 318D may be provided on the upper interlayer insulation layer 316. The second source electrode 318S and the second drain electrode 318D may be connected with the second active layer 311. The second source electrode 318S and the second drain electrode 318D may be respectively connected with the second source region 311S and the second drain region 311D through a third contact hole CH3 and a fourth contact hole CH4. The third contact hole CH3 and the fourth contact hole CH4 may be formed to pass through the upper interlayer insulation layer 316 and the upper gate insulation layer 313. For example, the second source electrode 318S and the second drain electrode 318D may include a single layer or a multilayer, which includes one of Mo, Al, Cr, Au, Ti, Ni, Nd, and Cu, or an alloy thereof.

The light blocking layer 308 may be disposed under the second active layer 311 with a second sub buffer layer 310b and a third sub buffer layer 310c therebetween. The light blocking layer 308 may overlap the second active layer 311. A width of the light blocking layer 308 may be formed to be greater than or equal to that of the second active layer 311 and may overlap a whole lower surface of the second active layer 311. For example, the light blocking layer 308 may be disposed in the upper buffer layer 310. For example, the light blocking layer 308 may be disposed between a first sub buffer layer 310a and the second sub buffer layer 310b. Here, the second sub buffer layer 310b may be configured to cover all of an upper surface and a lateral surface of the light blocking layer 308. For example, the light blocking layer 308 may be formed of a material (for example, a metal material such as Ti) which is good in collection capability with respect to hydrogen particles. For example, the light blocking layer 308 may be a single layer of Ti, a multilayer of Mo and Ti, or an alloy (MoTi) of Mo and Ti. For example, the second sub buffer layer 310*b* may include SiNx.

The switching TFT 360 may include a second lower gate electrode 306, a lower interlayer insulation layer 307, an upper buffer layer 310, a third active layer 312, the upper gate insulation layer 313, a second upper gate electrode 314, the upper interlayer insulation layer 316, a third source electrode 319S, and a third drain electrode 319D.

The second lower gate electrode 306 may be provided on the lower gate insulation layer 302. The second lower gate electrode 306 may overlap the third active layer 312. The second lower gate electrode 306 may include the same metal material as that of the first lower gate electrode 304. The second lower gate electrode 306 may be formed simultaneously by using the same one mask process as the first lower gate electrode 304. Accordingly, according to an embodiment of the present disclosure, a mask process may be simplified. In addition, the degradation prevention layer 390 may be formed to cover the top and sides of the second lower gate electrode 306.

The lower interlayer insulation layer 307 may be provided on the second lower gate electrode 306 and the degradation prevention layer 390. The lower interlayer insulation layer 307 may be provided to cover all of the second lower gate electrode 306 and the degradation prevention layer 390. For example, the lower interlayer insulation layer 307 may be an inorganic layer including SiNx.

The upper buffer layer 310 may be provided on the lower interlayer insulation layer 307. The upper buffer layer 310 may have a stack structure where the first sub buffer layer 310*a*, the second sub buffer layer 310*b*, and the third sub buffer layer 310*c* are sequentially stacked. For example, the first sub buffer layer 310*a* and the third sub buffer layer 310*c* may include SiOx including no hydrogen particle. For example, the lower interlayer insulation layer 307 including hydrogen particles may be disposed under the upper buffer layer 310. In this case, hydrogen particles occurring in a hydrogenation process of the driving circuit TFT 330 using a polycrystalline silicon semiconductor pattern as the first active layer 303 may pass through the upper buffer layer 310 and may penetrate into the third active layer 312.

Therefore, TFTs using the third active layer 312 as an active layer may have different threshold voltages, based on positions thereof, and a problem where a conductance of a channel is changed may occur. To prevent such a problem, the upper buffer layer 310 may include a plurality of sub buffer layers, and a material of a sub buffer layer, disposed at each of an uppermost end and a lowermost end, of the plurality of buffer layers may include SiOx. Accordingly, in an embodiment of the present disclosure, the reliability of the switching TFT 360 using an oxide semiconductor layer may be improved or secured.

The third active layer 312 may be provided on the upper buffer layer 310. The third active layer 312 may include an oxide semiconductor. The third active layer 312 may include an intrinsic third channel region 312C which is not doped, and a third source region 312S and a third drain region 312D which have conductivity by doping impurities. The third active layer 312 may include the same material as that of the second active layer 311 and may be formed simultaneously by using the same process. Accordingly, in an embodiment of the present disclosure, the third active layer 312 may be formed without adding a separate process.

The upper gate insulation layer 313 may be provided on the third active layer 312. The upper gate insulation layer 313 may be provided between the third active layer 312 and the second upper gate electrode 314. The upper gate insulation layer 313 may be provided to cover the third active layer 312.

The second upper gate electrode 314 may be provided on the upper gate insulation layer 313. The second upper gate electrode 314 may overlap the third active layer 312. The second upper gate electrode 314 may have the same width as that of the third channel region 312C of the third active layer 312. The second upper gate electrode 314 may include the same material as that of the first upper gate electrode 315 and may be formed simultaneously by using one mask process. Accordingly, in an embodiment of the present disclosure, a mask process may be simplified.

The upper interlayer insulation layer 316 may be provided on the second upper gate electrode 314. The upper interlayer insulation layer 316 may be formed to cover the second upper gate electrode 314.

The third source electrode 319S and the third drain electrode 319D may be provided on the upper interlayer insulation layer 316. The third source electrode 319S and the third drain electrode 319D may be connected with the third active layer 312. The third source electrode 319S and the third drain electrode 319D may be respectively connected with the third source region 312S and the third drain region 312D through a fifth contact hole CH5 and a sixth contact hole CH6. The fifth contact hole CH5 and the sixth contact hole CH6 may be formed to pass through the upper interlayer insulation layer 316 and the upper gate insulation layer 313. For example, the third source electrode 319S and the third drain electrode 319D may include the same material as that of the second source electrode 318S and the second drain electrode 318D and may be formed simultaneously through one mask process. Accordingly, in an embodiment of the present disclosure, a mask process may be simplified.

The degradation prevention layer 390 according to an embodiment of the present disclosure may be configured to absorb and/or scatter internal reflected light which is incident on an inner portion of a display panel from the outside and is reflected by a metal layer. The degradation prevention layer 390 according to an embodiment of the present disclosure may overlap at least a portion of the switching TFT 360. For example, the degradation prevention layer 390 may overlap the third switching TFT (T3) 360, which connects the first upper gate electrode 315 and the second source electrode 318S of the driving TFT 340 with each other such that the driving TFT 340 is connected in a diode structure, of the switching TFT 360.

The degradation prevention layer 390 may overlap one or more of a gate electrode 306 and 314, a source electrode 319S, and a drain electrode 319D of the switching TFT 360. For example, the degradation prevention layer 390 may overlap one or more of a second lower gate electrode 306, a second upper gate electrode 314, a third source electrode 319S, and a third drain electrode 319D of the switching TFT 360.

The degradation prevention layer 390 may be provided between the third active layer 312 and one or more of the second lower gate electrode 306, the second upper gate electrode 314, the third source electrode 319S, and the third drain electrode 319D of the switching TFT 360. For example, the degradation prevention layer 390 may be disposed in a peripheral region of the third active layer 312, or adjacent to the third active layer 312, to at least partially surround the third active layer 312.

Therefore, in an embodiment of the present disclosure, the strength of internal reflected light which is incident on the inner portion of the display panel from the outside and is reflected by one or more of the second lower gate electrode 306, the second upper gate electrode 314, the third source electrode 319S, and the third drain electrode 319D may be reduced. For example, in an embodiment of the present disclosure, external light incident on the inner portion of the display panel from the outside may be absorbed and/or scattered by the degradation prevention layer 390, and thus, the strength of light reaching the third active layer 312 may be reduced. Accordingly, in an embodiment of the present disclosure, the third active layer 312 including oxide semiconductor material may be alleviated or prevented from being degraded.

The degradation prevention layer 390 according to an embodiment of the present disclosure may include a first degradation prevention layer 391. The first degradation prevention layer 391 may be provided on the second lower gate electrode 306 of the third switching TFT 360. The first degradation prevention layer 391 may cover the second lower gate electrode 306 of the third switching TFT 360. The first degradation prevention layer 391 may cover all of an upper surface and a lateral surface of the second lower gate electrode 306 of the third switching TFT 360. The lower interlayer insulation layer 307 may be formed on the first degradation prevention layer 391. In this case, the lower interlayer insulation layer 307 may cover the first degradation prevention layer 391.

The first degradation prevention layer 391 may be provided between the third active layer 312 and the second lower gate electrode 306 of the third switching TFT 360. The first degradation prevention layer 391 may overlap a whole lower surface of the third active layer 312. In this case, a width of the first degradation prevention layer 391 may be greater than or equal to that of the third active layer 312. Accordingly, the first degradation prevention layer 391 may prevent light, which is incident from the outside of the display panel, from being reflected by the second lower gate electrode 306 of the third switching TFT 360 and may more stably absorb and/or scatter light.

The first degradation prevention layer 391 may be an inorganic layer having a high haze characteristic. For example, a haze may be a phenomenon where light is diffused based on unique properties of a material other than reflection or absorption when passing through an inner portion of a material (for example, an inorganic layer), based on the kind of material. For example, the haze may be defined as the degree to which light incident on a material is diffused. For example, the first degradation prevention layer 391 may be an inorganic layer including titanium oxide ($TiO_2$) or aluminum oxide ($Al_2O_3$). For example, a thickness of the first degradation prevention layer 391 may be about 20 nm or less. For example, when the thickness of the first degradation prevention layer 391 is greater than about 20 nm, relative surface roughness may be improved, and thus, the haze characteristic may be reduced. Accordingly, the thickness of the first degradation prevention layer 391 may be set to about 20 nm or less. For example, the thickness of the first degradation prevention layer 391 may be about 10 nm or more (or more than 10 nm) and about 15 nm or less (or less than about 15 nm) (or about 10 nm to about 15 nm).

A metal line or pattern such as the second lower gate electrode 306 may have a high light reflectance in unique metal properties. Therefore, when external light incident from the outside of the display panel is incident on the metal line or pattern, light may be hardly absorbed and may be reflected from a surface of the metal line or pattern and may be discharged to the outside. Reflected light discharged to the outside may reach the third active layer 312 disposed adjacent to the second lower gate electrode 306 and may cause a variation of a threshold voltage Vth of the third active layer 312, causing a degradation in device such as the third switching TFT 360.

To prevent such a problem, in an embodiment of the present disclosure, the first degradation prevention layer 391 may be disposed on an upper surface of the second lower gate electrode 306, and thus, may decrease the strength of internal light reflected from a surface of the second lower gate electrode 306 and may disperse a directionality of reflected light.

Therefore, in an embodiment of the present disclosure, because the degradation prevention layer 390 is provided, the strength of light which is incident on the inner portion of the display panel from the outside and is reflected by a metal line or pattern may be reduced, and the occurrence of a degradation in the third active layer 312 including oxide semiconductor material may be prevented or reduced.

Accordingly, in an embodiment of the present disclosure, the luminance uniformity and reliability of the switching TFT 360 (which may also be referred to as oxide TFT 360) may be improved or enhanced.

The first planarization layer 320 may be provided on the driving circuit TFT 330, the driving TFT 340, and the switching TFT 360. For example, the first planarization layer 320 may include an organic layer such as polyimide or acryl resin.

The connection electrode 321 may be provided on the first planarization layer 320. The connection electrode 321 may include a first connection electrode 321a, a second connection electrode 321b, and a third connection electrode 321c. The first connection electrode 321a may be connected with the first drain electrode 317D of the driving circuit TFT 330 through an eighth contact hole CH8. The second connection electrode 321b may be connected with the second drain electrode 318D of the driving TFT 340 through a ninth contact hole CH9. The third connection electrode 321c may be connected with the third drain electrode 319D of the switching TFT 360 through a tenth contact hole CH10. The eighth contact hole CH8, the ninth contact hole CH9, and the tenth contact hole CH10 may be provided in the first planarization layer 320. For example, the connection electrode 321 may include a single layer or a multilayer, which includes one of Mo, Al, Cr, Au, Ti, Ni, Nd, and Cu, or an alloy thereof.

The second planarization layer 322 may be provided on the connection electrode 321. For example, the second planarization layer 322 may include an organic layer such as polyimide or acryl resin.

The light emitting device layer EL may be provided on the second planarization layer 322. The light emitting device layer EL may include a first electrode 323, an emission layer 325, and a second electrode 327.

The first electrode 323 may be provided on the second planarization layer 322. The first electrode 323 may be connected with the second drain electrode 318D of the driving TFT 340 through an eleventh contact hole CH11. The first electrode 323 may be connected with the second drain electrode 318D through the second connection electrode 321b. The eleventh contact hole CH11 may be provided in the second planarization layer 322. For example, the first electrode 323 may be formed in a multi-layer structure which includes a transparent conductive layer and an opaque conductive layer having high reflection efficiency. The transparent conductive layer may include a material, having a relatively large work function value, such as indium-tin-oxide (ITO) or indium-zinc-oxide (IZO), and the opaque conductive layer may include a single-layer or multi-layer structure which includes Al, silver (Ag), Cu, lead (Pb), Mo, Ti, or an alloy thereof. For example, the first electrode 323 may be formed in a structure in which a transparent conductive layer, an opaque conductive layer, and a transparent conductive layer are sequentially stacked. However, the present disclosure is not limited thereto, and a structure in which a transparent conductive layer and an opaque conductive layer are sequentially stacked may also be formed.

A secondary electrode 329 may be provided on the same layer as the first electrode 323. The secondary electrode 329 may be provided in the non-display area NA of the substrate 101. The secondary electrode 329 may be adjacent to the first electrode 323 and may be connected with the second electrode 327. The secondary electrode 329 may include the same material as that of the first electrode 323 and may be formed simultaneously by using the same mask process.

The emission layer 325 may be formed on the first electrode 323 by stacking a hole injection/transport layer, an organic emission layer, and an electron injection/transport layer in order or in reverse order.

The display apparatus according to an embodiment of the present disclosure may further include a bank layer 324 and a spacer 326. The bank layer 324 may be formed on the second planarization layer 322 to cover one side and the other side of the first electrode 323 of each subpixel. The bank layer 324 may be a pixel definition layer which defines an emission region of each subpixel. For example, the bank layer 324 may include an opaque material so as to prevent or at least reduce light interference between adjacent subpixels. In this case, the bank layer 324 may include a light blocking material including at least one of a colored pigment, organic black, and carbon. The display apparatus according to an embodiment of the present disclosure may also include, but not limited to, a spacer 326. The spacer 326 may be disposed on the bank layer 324. The spacer 326 and the bank layer 324 may be integrated with the same organic insulating material. The spacer 326 may ensure a gap between a fine metal mask (FMM) and the first electrode 323 so that the FMM is not in contact with the first electrode 323 in a deposition process of the emission layer 325.

The second electrode 327 may be opposite to the first electrode 323 with the emission layer 325 therebetween and may be provided on an upper surface and a lateral surface of the emission layer 325. The second electrode 327 may be provided as one body in a whole surface of the display area. In a case where the second electrode 327 is applied to an organic light emitting display apparatus of a top emission type, the second electrode 327 may include a transparent conductive layer such as ITO or IZO.

The encapsulation layer 328 may be provided on a whole upper surface of the second planarization layer 322. The encapsulation layer 328 may include a plurality of inorganic encapsulation layers which prevent or at least reduce the penetration of water and oxygen and at least one organic encapsulation layer which prevents the inflow or flow of particles. The encapsulation layer 328 may include a first inorganic encapsulation layer 328a, a second organic encapsulation layer 328b, and a third inorganic encapsulation layer 328c, which are sequentially stacked. For example, the first inorganic encapsulation layer 328a and the third inorganic encapsulation layer 328c may include an inorganic material such as SiOx. The second organic encapsulation layer 328b may include an organic material such as acryl resin, epoxy resin, phenolic resin, polyamide resin, or polyimide resin.

The touch buffer layer 710 may be provided on the encapsulation layer 328. The touch buffer layer 710 may prevent water from the outside or a chemical solution (for example, a developing solution or an etching solution), used in a manufacturing process of the touch sensor layer 700, from penetrating into the emission layer 325 including an organic material. Also, a problem may be solved where a plurality of touch sensor metal patterns disposed on the touch buffer layer 710 are disconnected by an external impact, and an interference signal occurring in driving of the touch sensor layer 700 may be reduced or prevented. For example, the touch buffer layer 710 may include a single layer or a multilayer, which includes one of SiOx and SiNx or an alloy thereof. As another example, the touch buffer layer 710 may include an organic material such as acryl resin, epoxy resin, phenolic resin, polyamide resin, or polyimide resin.

The touch sensor layer 700 may be provided on the touch buffer layer 710. The touch sensor layer 700 may include a first touch connection electrode BE1, a first touch electrode TX1, a second touch electrode, and a second touch connection electrode RX1.

The first touch connection electrode BE1 may be disposed between first touch electrodes TX1 adjacent to each other in a first direction (or an X-axis direction). The first touch connection electrode BE1 may electrically connect a plurality of first touch electrodes TX1 which are arranged apart from and adjacent to each other in the first direction (or the X-axis direction), but embodiments of the present disclosure are not limited thereto.

The first touch connection electrode BE1 may be disposed to overlap the second touch connection electrode RX1 connecting second touch electrodes adjacent to each other in a second direction (or a Y-axis direction). The first touch connection electrode BE1 and the second touch connection electrode RX1 may be formed on different layers, and thus, may be electrically insulated from each other.

The touch insulation layer 730 may include a hole for electrically connecting the first touch electrode TX1 with the first touch connection electrode BE1. The touch insulation layer 730 may electrically insulate the second touch electrode and the second touch connection electrode RX1 from the first touch connection electrode BE1. For example, the touch insulation layer 730 may include a single layer of SiNx or SiOx or a multilayer thereof, but embodiments of the present disclosure are not limited thereto.

The first touch electrode TX1 and the second touch electrode may be arranged apart from each other by a certain interval. One or more first touch electrodes TX1 adjacent to each other in the first direction (or the X-axis direction) may be arranged apart from each other. Each of one or more first touch electrodes TX1 adjacent to each other in the first direction (or the X-axis direction) may be connected with the first touch connection electrode BE1 disposed between adjacent first touch electrodes TX1. For example, each first touch electrode TX1 may be connected with the first touch connection electrode BE1 through a hole of the touch insulation layer 730.

Second touch electrodes may be adjacent to each other in the second direction (or the Y-axis direction), and may be connected with each other through the second touch connection electrode RX1. The second touch electrode and the second touch connection electrode RX1 may be formed on the same layer. For example, the second touch connection electrode RX1 may be disposed between a plurality of second touch electrodes, on the same layer as the second touch electrode. The second touch connection electrode RX1 may be formed to extend from the second touch electrode.

The first touch electrode TX1, the second touch electrode, and the second touch connection electrode RX1 may be formed by the same process. The first touch electrode TX1 and the second touch electrode may have a mesh electrode structure. The first touch connection electrode BE1 and the second touch connection electrode RX1 may also have the mesh electrode structure.

The touch planarization layer 750 may be provided on the first touch electrode TX1, the second touch electrode, and the second touch connection electrode RX1. The touch planarization layer 750 may be provided to cover the touch insulation layer 730, the first touch electrode TX1, the second touch electrode, and the second touch connection electrode RX1. For example, the touch planarization layer 750 may include one or more of organic insulating materials such as benzocyclobutene (BCB), acryl resin, epoxy resin, phenolic resin, polyamide resin, and polyimide resin.

A touch driving circuit disposed in the non-display area NA of the display panel may receive a touch sensing signal from the first touch electrode TX1. Also, the touch driving circuit may transfer a touch driving signal to the second touch electrode. In another example, the touch driving circuit may transfer a touch driving signal to the first touch electrode TX1 and receive a touch sensing signal from the second touch electrode. The touch driving circuit may sense a touch (for example, by a user) by using a mutual capacitance between a plurality of first touch electrodes TX1 and second touch electrodes. For example, when a touch operation is performed on the display apparatus 100, a variation of a capacitance may occur between the first touch electrode TX1 and the second touch electrode. The touch driving circuit may sense a variation of a capacitance to detect touch coordinates. Although the touch sensor layer 700 according to embodiments of the present disclosure is described that the touch is sensed by mutual-capacitance method, the present disclosure is not limited thereto. For example, the touch sensor layer 700 may be implemented as including a plurality of touch electrodes, each of which may serve as both a driving touch electrode and a sensing touch electrode, such that the touch is sensed by a self-capacitance method, in which the touch sensing can be performed by detecting a variation in self-capacitance between a touch object (e.g., a finger, a pen, etc.) and the touch electrode.

As described above, the display apparatus according to an embodiment of the present disclosure may reduce a degradation in the switching TFT (T3) 360 caused by the reflection of light by using the degradation prevention layer 390.

It is to be noted that the specific structure of the display apparatus is not limited to that shown in FIG. 4. For example, the touch buffer layer 710, and the touch sensor layer 700 may be omitted, and one or more layers shown in FIG. 4 may also be omitted, changed, or replaced with one or more other layers. For example, the third switching TFT 360 may have a top gate type where only the second upper gate electrode 314 is disposed, or a bottom gate type where only the second lower gate electrode 306 is disposed. In a case that the third switching TFT 360 is formed as the top gate type, the first degradation prevention layer 391 may also be formed under the third active layer 312.

In the following description, only modified elements will be described in detail, and the other elements may be referred to by the same reference numerals as FIG. 4 and repeated descriptions thereof are omitted or will be briefly given.

Figure 5:
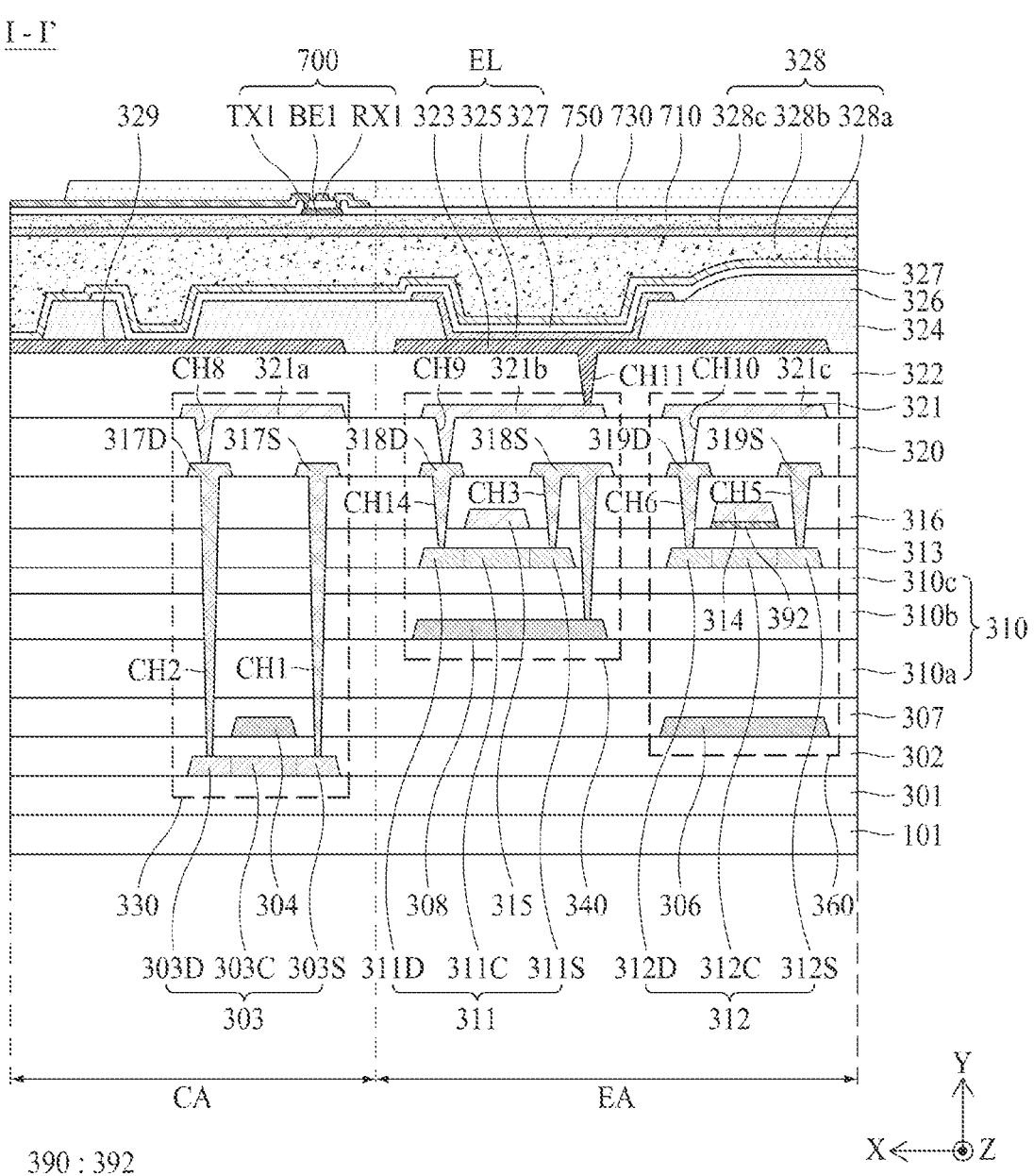
FIG. 5 is a cross-sectional view along line I-I' of the display apparatus according to another embodiment of the present disclosure.

FIG. 5 is a cross-sectional view along line I-I' of the display apparatus according to another embodiment of the present disclosure. Except for a position at which a degradation prevention layer 390 is disposed, another embodiment of the present disclosure may be the same as or similar to an embodiment of the present disclosure described above with reference to FIG. 4. Hereinafter, therefore, repeated descriptions of the same elements are omitted or may be briefly provided, and only the degradation prevention layer 390 and elements relevant thereto will be described.

Referring to FIG. 5, a degradation prevention layer 390 according to another embodiment of the present disclosure may include a second degradation prevention layer 392. The second degradation prevention layer 392 may be provided under the second upper gate electrode 314 of the third switching TFT 360. The second degradation prevention layer 392 may contact a lower surface of the second upper gate electrode 314 of the third switching TFT 360. The second degradation prevention layer 392 may overlap the whole lower surface of the second upper gate electrode 314 of the third switching TFT 360.

The second degradation prevention layer 392 may be provided between the third active layer 312 and the second upper gate electrode 314 of the third switching TFT 360. A width of the second degradation prevention layer 392 may be greater than or equal to that of the second upper gate electrode 314 of the third switching TFT 360.

The second degradation prevention layer 392 may include the same material as that of the first degradation prevention layer 391 described above with reference to FIG. 4. For example, a thickness of the second degradation prevention layer 392 may be about 20 nm or less. For example, when the thickness of the second degradation prevention layer 392 is greater than about 20 nm, relative surface roughness may be improved, and thus, a haze characteristic may be reduced. Accordingly, the thickness of the second degradation prevention layer 392 may be set to about 20 nm or less. For example, the thickness of the second degradation prevention layer 392 may be about 10 nm or more (or more than 10 nm) and about 15 nm or less (or less than about 15 nm) (or about 10 nm to about 15 nm).

A metal line or pattern such as the second upper gate electrode 314 may have a high light reflectance in unique metal properties. Therefore, when external light incident from the outside of the display panel is incident on the metal line or pattern, light may be hardly absorbed and may be reflected from a surface of the metal line or pattern and may be discharged to the outside. Reflected light discharged to the outside may reach the third active layer 312 disposed adjacent to the second upper gate electrode 314 and may cause a variation of a threshold voltage Vth of the third active layer 312, causing a degradation in device such as the third switching TFT 360.

To prevent such a problem, in another embodiment of the present disclosure, the second degradation prevention layer 392 may be disposed below a lower surface of the second upper gate electrode 314, and thus, may decrease the strength of internal light reflected from a surface of the second upper gate electrode 314 and may disperse a directionality of reflected light.

Therefore, in another embodiment of the present disclosure, because the degradation prevention layer 390 is provided, the strength of light which is incident on the inner portion of the display panel from the outside and is reflected by a metal line or pattern may be reduced, and the occurrence of a degradation in the third active layer 312 including oxide semiconductor material may be reduced or prevented.

Accordingly, in another embodiment of the present disclosure, the luminance uniformity and reliability of the oxide TFT 360 may be improved or enhanced.

Figure 6:
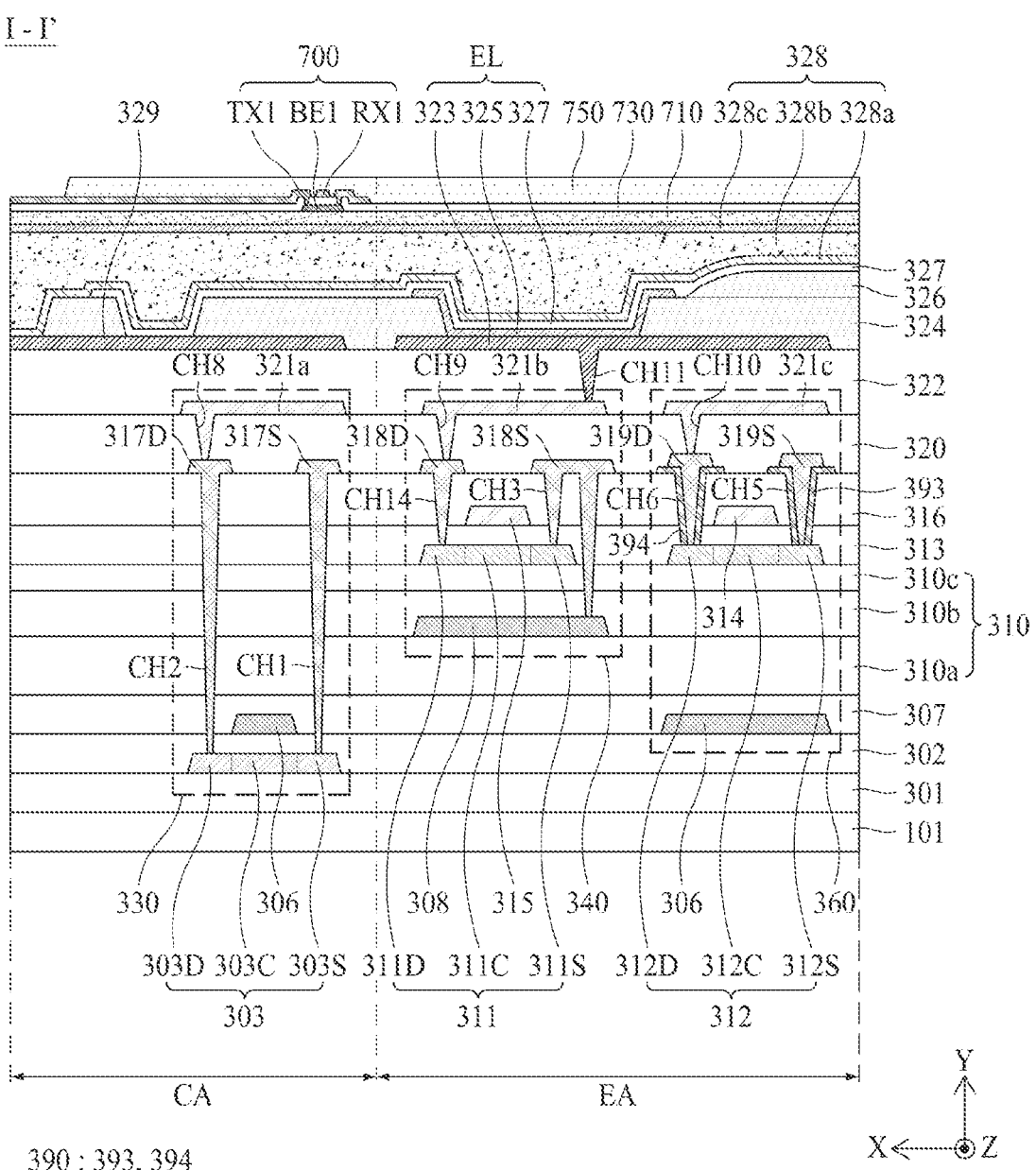
FIG. 6 is a cross-sectional view along line I-I' of the display apparatus according to another embodiment of the present disclosure.

FIG. 6 is a cross-sectional view along line I-I' of the display apparatus according to another embodiment of the present disclosure. Except for a position at which a degradation prevention layer 390 is disposed, another embodiment of the present disclosure may be the same as or similar to an embodiment of the present disclosure described above with reference to FIG. 4. Hereinafter, therefore, repeated descriptions of the same elements are omitted or may be briefly provided, and only the degradation prevention layer 390 and elements relevant thereto will be described.

Referring to FIG. 6, a degradation prevention layer 390 according to another embodiment of the present disclosure may include a third degradation prevention layer 393 and a fourth degradation prevention layer 394. The third degradation prevention layer 393 and the fourth degradation prevention layer 394 may be provided under the third source electrode 319S and the third drain electrode 319D of the third switching TFT 360. The third degradation prevention layer 393 and the fourth degradation prevention layer 394 may be provided between the third active layer 312 and each of the third source electrode 319S and the third drain electrode 319D, in the third switching TFT 360. For example, each of the third source electrode 319S and the third drain electrode 319D may be provided along a surface of each of the fifth contact hole CH5 and the sixth contact hole CH6 which are provided to pass through the upper gate insulation layer 313 and the upper interlayer insulation layer 316. In this case, the third degradation prevention layer 393 may be provided between the third source electrode 319S and the upper gate insulation layer 313 and the upper interlayer insulation layer 316, and the fourth degradation prevention layer 394 may be provided between the third drain electrode 319D and the upper gate insulation layer 313 and the upper interlayer insulation layer 316.

The third degradation prevention layer 393 may contact the third source electrode 319S of the third switching TFT 360. The third degradation prevention layer 393 may directly contact a lower surface of the third source electrode 319S of the third switching TFT 360. The third degradation prevention layer 393 may be provided on the whole lower surface of the third source electrode 319S disposed on the upper interlayer insulation layer 316. Also, the third degradation prevention layer 393 may be provided between the third source electrode 319S and a lateral surface of the fifth contact hole CH5. In this case, the third degradation prevention layer 393 may not be provided in a contact region where the third source electrode 319S contacts the third active layer 312. For example, the third Degradation prevention layer 393 may be formed without hindering a connection between the third source electrode 319S and the third active layer 312. For example, the third source electrode 319S may pass through the third degradation prevention layer 393 and may be electrically connected with or contact the third active layer 312.

The fourth degradation prevention layer 394 may contact a lower surface of the third drain electrode 319D. The fourth degradation prevention layer 394 may be provided on the whole lower surface of the third drain electrode 319D disposed on the upper interlayer insulation layer 316. Also, the fourth degradation prevention layer 394 may be provided between the third drain electrode 319D and a lateral surface of the sixth contact hole CH6. In this case, the fourth degradation prevention layer 394 may not be provided in a contact region where the third drain electrode 319D contacts the third active layer 312. For example, the fourth degradation prevention layer 394 may be formed without hindering a connection between the third drain electrode 319D and the third active layer 312. For example, the third drain electrode 319D may pass through the fourth degradation prevention layer 394 and may be electrically connected with or contact the third active layer 312.

The third degradation prevention layer 393 and the fourth degradation prevention layer 394 may include the same material as that of the first degradation prevention layer 391 described above with reference to FIG. 4. For example, a thickness of each of the third degradation prevention layer 393 and the fourth degradation prevention layer 394 may be about 20 nm or less. For example, the thickness of each of the third degradation prevention layer 393 and the fourth degradation prevention layer 394 may be about 10 nm or more (or more than 10 nm) and about 15 nm or less (or less than about 15 nm) (or about 10 nm to about 15 nm).

A metal line or pattern such as the third source electrode 319S and the third drain electrode 319D may have a high light reflectance in unique metal properties. Therefore, when external light incident from the outside of the display panel is incident on the metal line or pattern, light may be hardly absorbed and may be reflected from a surface of the metal line or pattern and may be discharged to the outside. Reflected light discharged to the outside may reach the third active layer 312 disposed adjacent to the third source electrode 319S and the third drain electrode 319D and may cause a variation of a threshold voltage Vth of the third active layer 312, causing a degradation in device such as the third switching TFT 360.

To prevent such a problem, in another embodiment of the present disclosure, the third degradation prevention layer 393 and the fourth degradation prevention layer 394 may be respectively disposed on lower surfaces of the third source electrode 319S and the third drain electrode 319D, and thus, may decrease the strength of internal light reflected from a surface of each of the third source electrode 319S and the third drain electrode 319D and may disperse a directionality of reflected light.

Therefore, in another embodiment of the present disclosure, because the degradation prevention layer 390 is provided, the strength of light which is incident on the inner portion of the display panel from the outside and is reflected by a metal line or pattern may be reduced, and the occurrence of a degradation in the third active layer 312 including oxide semiconductor material may be reduced or prevented.

Accordingly, in another embodiment of the present disclosure, the luminance uniformity and reliability of the oxide TFT 360 may be improved or enhanced.

Figure 7:
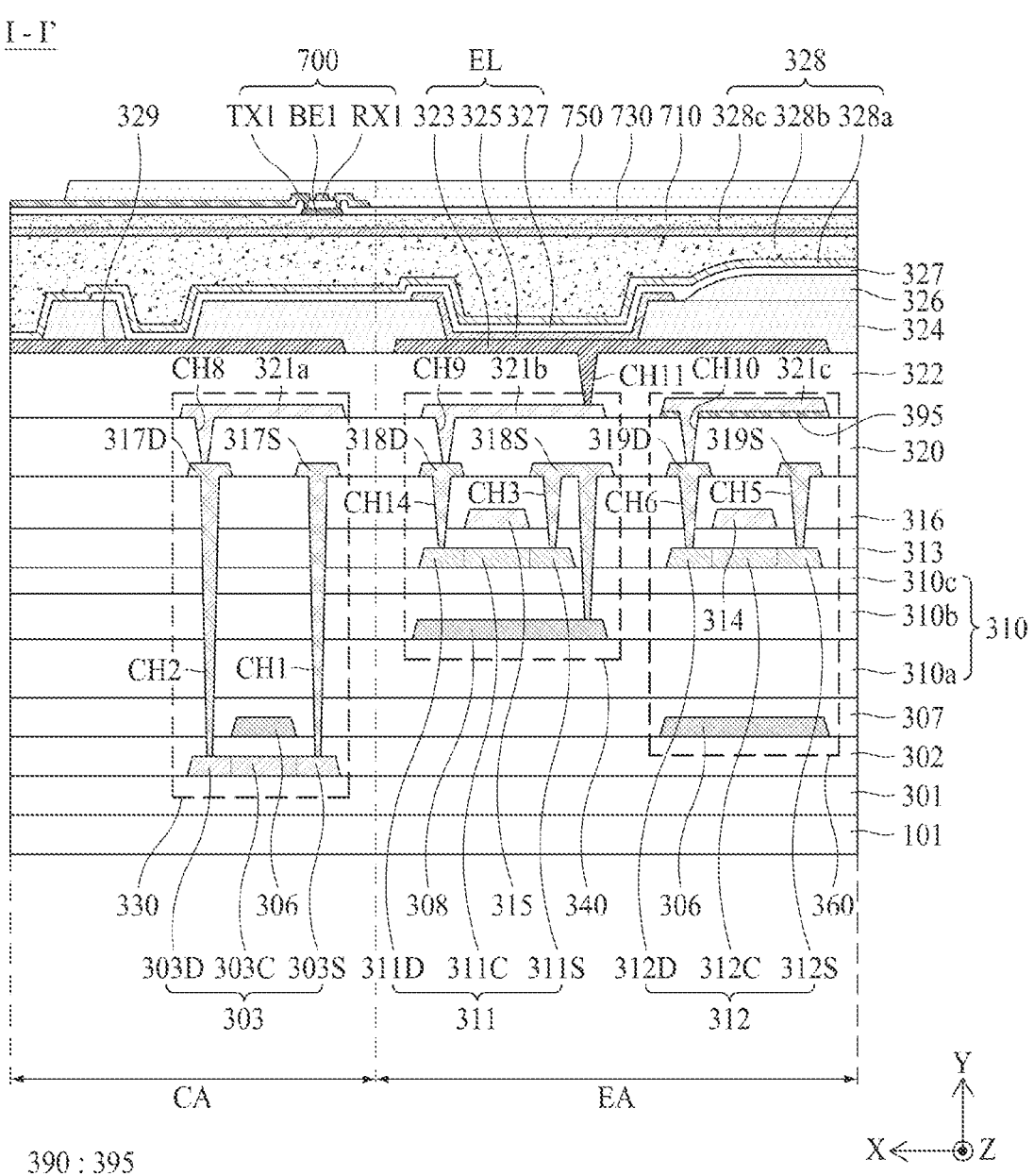
FIG. 7 is a cross-sectional view along line I-I' of the display apparatus according to another embodiment of the present disclosure.

FIG. 7 is a cross-sectional view along line I-I' of the display apparatus according to another embodiment of the present disclosure. Except for a position at which a degradation prevention layer 390 is disposed, another embodiment of the present disclosure may be the same as or similar to an embodiment of the present disclosure described above with reference to FIG. 4. Hereinafter, therefore, repeated descriptions of the same elements are omitted or may be briefly provided, and only the degradation prevention layer 390 and elements relevant thereto will be described.

Referring to FIG. 7, a degradation prevention layer 390 according to another embodiment of the present disclosure may include a fifth degradation prevention layer 395. The fifth degradation prevention layer 395 may be provided under the third connection electrode 321c provided on the first planarization layer 320. The fifth degradation prevention layer 395 may be provided between the third connection electrode 321c and the third active layer 312.

The fifth degradation prevention layer 395 may contact a lower surface of the third connection electrode 321c. The fifth degradation prevention layer 395 may be provided on the whole lower surface of the third connection electrode 321c provided on the first planarization layer 320. Also, the fifth degradation prevention layer 395 may be provided between the third connection electrode 321c and a lateral surface of the tenth contact hole CH10. In this case, the fifth degradation prevention layer 395 may not be provided in a contact region where the third connection electrode 321c contacts the third active layer 312. For example, the fifth degradation prevention layer 395 may be formed without hindering a connection between the third connection electrode 321c and the third active layer 312. For example, the third connection electrode 321c may pass through the fifth degradation prevention layer 395 and may be electrically connected with or contact the third active layer 312.

The fifth degradation prevention layer 395 may include the same material as that of the first degradation prevention layer 391 described above with reference to FIG. 4. For example, a thickness of the fifth degradation prevention layer 395 may be about 20 nm or less. For example, the thickness of the fifth degradation prevention layer 395 may be about 10 nm or more (or more than 10 nm) and about 15 nm or less (or less than about 15 nm) (or about 10 nm to about 15 nm).

A metal line or pattern such as the third connection electrode 321c may have a high light reflectance in unique metal properties. Therefore, when external light incident from the outside of the display panel is incident on the metal line or pattern, light may be hardly absorbed and may be reflected from a surface of the metal line or pattern and may be discharged to the outside. Reflected light discharged to the outside may reach the third active layer 312 disposed adjacent to the third connection electrode 321c and may cause a variation of a threshold voltage Vth of the third active layer 312, causing a degradation in device such as the third switching TFT 360.

To prevent or at least reduce such a problem, in another embodiment of the present disclosure, the fifth degradation prevention layer 395 may be disposed on lower surfaces of the third connection electrode 321c, and thus, may decrease the strength of internal light reflected from a lower surface of the third connection electrode 321c and may disperse a directionality of reflected light.

Therefore, in another embodiment of the present disclosure, because the degradation prevention layer 390 is provided, the strength of light which is incident on the inner portion of the display panel from the outside and is reflected by a metal line or pattern may be reduced, and the occurrence of a degradation in the third active layer 312 including oxide semiconductor material may be reduced or prevented.

Accordingly, in another embodiment of the present disclosure, the luminance uniformity and reliability of the oxide TFT 360 may be improved or enhanced.

Figure 8:
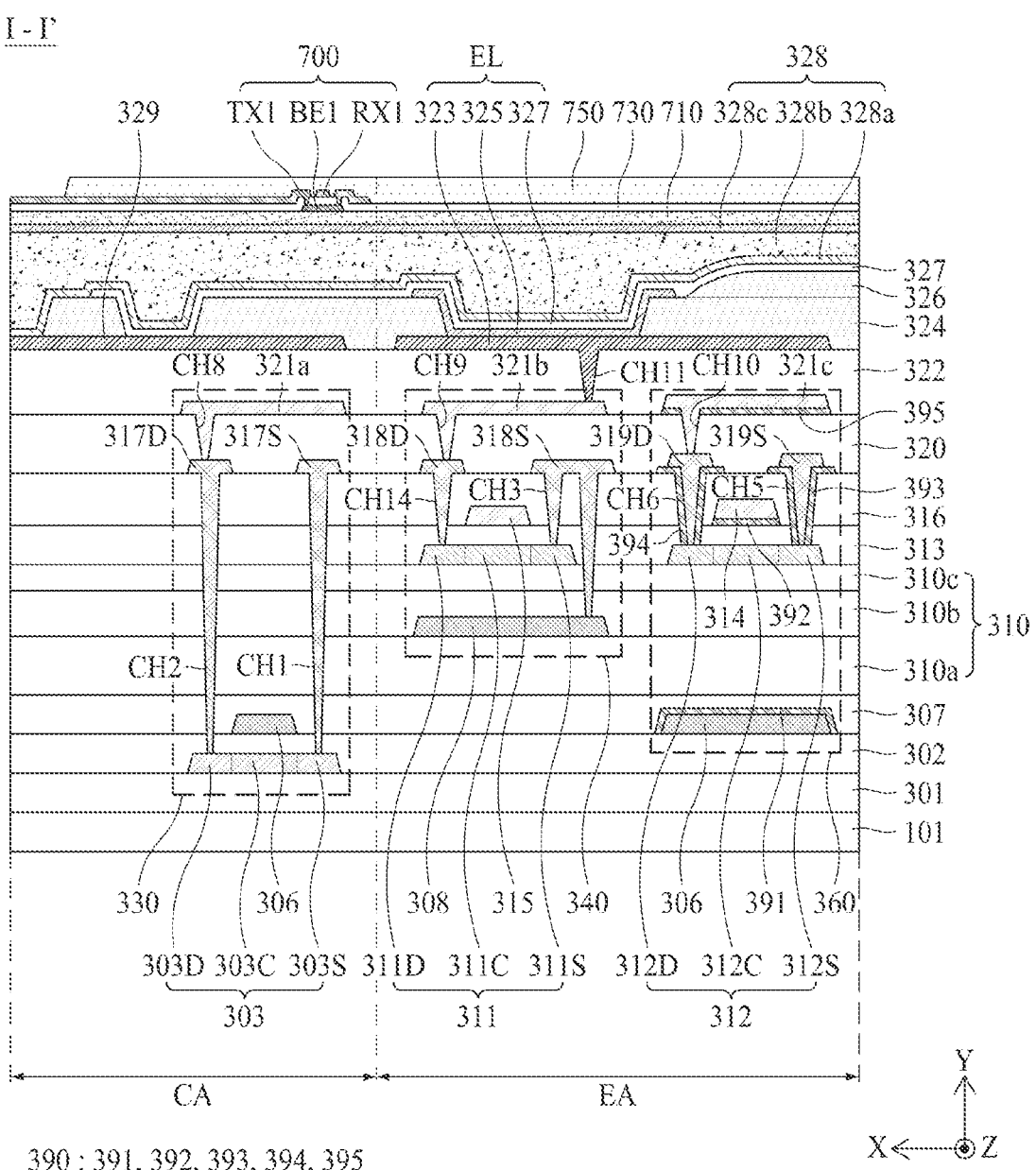
FIG. 8 is a cross-sectional view along line I-I' of the display apparatus according to another embodiment of the present disclosure.

FIG. 8 is a cross-sectional view along line I-I' of the display apparatus according to another embodiment of the present disclosure. Except for a position at which a degradation prevention layer 390 is disposed, another embodiment of the present disclosure may be the same as or similar to an embodiment of the present disclosure described above with reference to FIGS. 4 to 7. Hereinafter, therefore, repeated descriptions of the same elements are omitted or may be briefly provided, and only the degradation prevention layer 390 and elements relevant thereto will be described.

Referring to FIG. 8, a degradation prevention layer 390 according to another embodiment of the present disclosure may include first to fifth degradation prevention layers 391 to 395. The first degradation prevention layer 391 may be provided on the second lower gate electrode 306 and may cover the second lower gate electrode 306. The second degradation prevention layer 392 may be provided under the second upper gate electrode 314 and may overlap the whole lower surface of the second upper gate electrode 314. The third degradation prevention layer 393 may be provided under the third source electrode 319S and may be disposed on the whole lower surface of the third source electrode 319S disposed on the upper interlayer insulation layer 316. The fourth degradation prevention layer 394 may be provided under the third drain electrode 319D and may be disposed on the whole lower surface of the third drain electrode 319D disposed on the upper interlayer insulation layer 316. The fifth degradation prevention layer 395 may be provided under the third connection electrode 321c provided on the first planarization layer 320 and contact with the third connection electrode 321c.

Each of the first to fifth degradation prevention layers 391 to 395 according to another embodiment of the present disclosure may be provided between the third active layer 312 and each of the second lower gate electrode 306, the second upper gate electrode 314, the third source electrode 319S, the third drain electrode 319D, and the third connection electrode 321c, and thus, may be implemented to surround the third active layer 312.

Therefore, in another embodiment of the present disclosure, the first to fifth degradation prevention layers 391 to 395 may be disposed between the third active layer 312 and each of the second lower gate electrode 306, the second upper gate electrode 314, the third source electrode 319S, the third drain electrode 319D, and the third connection electrode 321c to surround the third active layer 312, and thus, the strength of internal light may be more effectively reduced and a directionality of reflected light may be more effectively dispersed.

Therefore, in another embodiment of the present disclosure, the degradation prevention layer 390 may be provided at a periphery of the third active layer 312 to surround the third active layer 312, and thus, the strength of light which is incident on the inner portion of the display panel from the outside and is reflected may be reduced and the occurrence of a degradation in the third active layer 312 including oxide semiconductor material may be more effectively reduced or prevented.

Therefore, in another embodiment of the present disclosure, the luminance uniformity and the reliability of the oxide TFT 360 may be more improved or enhanced.

Furthermore, the present disclosure will be described as an example where the degradation prevention layer 390 overlaps the third switching TFT T3, but the degradation prevention layer 390 may also overlap the third switching TFT T3 and the storage capacitor Cst. When the degradation prevention layer 390 overlaps the storage capacitor Cst, the degradation prevention layer 390 may be formed simultaneously with the first and second lower gate electrodes 304 and 306, and for example, may be disposed on a third lower gate electrode which may be used as a capacitor electrode of the storage capacitor Cst. The degradation prevention layer 390 may cover all of an upper surface and a lateral surface of the third lower gate electrode. In this case, the degradation prevention layer 390 may be an inorganic layer having a high haze characteristic. For example, the degradation prevention layer 390 may be an inorganic layer including $TiO_2$ or $Al_2O_3$. For example, a thickness of the degradation prevention layer 390 may be about 20 nm or less. For example, the thickness of the first degradation prevention layer 391 may be about 10 nm or more (or more than 10 nm) and about 15 nm or less (or less than about 15 nm) (or about 10 nm to about 15 nm).

When the degradation prevention layer 390 overlaps the storage capacitor Cst and is an inorganic layer including $TiO_2$, a characteristic of the storage capacitor Cst may be improved or enhanced by about 2% to about 85%.

It is to be noted that although embodiments of the present disclosure are described such that the degradation prevention layer 390 includes each of the first to fifth degradation prevention layers 391 to 395, or includes all of the first to fifth degradation prevention layers 391 to 395, but the present disclosure is not limited thereto. In other examples, the degradation prevention layer 390 may include any two or more of the first to fifth degradation prevention layers 391 to 395. In addition, the degradation prevention layer 390 may also include one or more degradation prevention layers provided around the third active layer 312 of the third switching TFT 360, other than the first to fifth degradation prevention layers 391 to 395, and the present disclosure is not limited thereto.

Figure 9A:
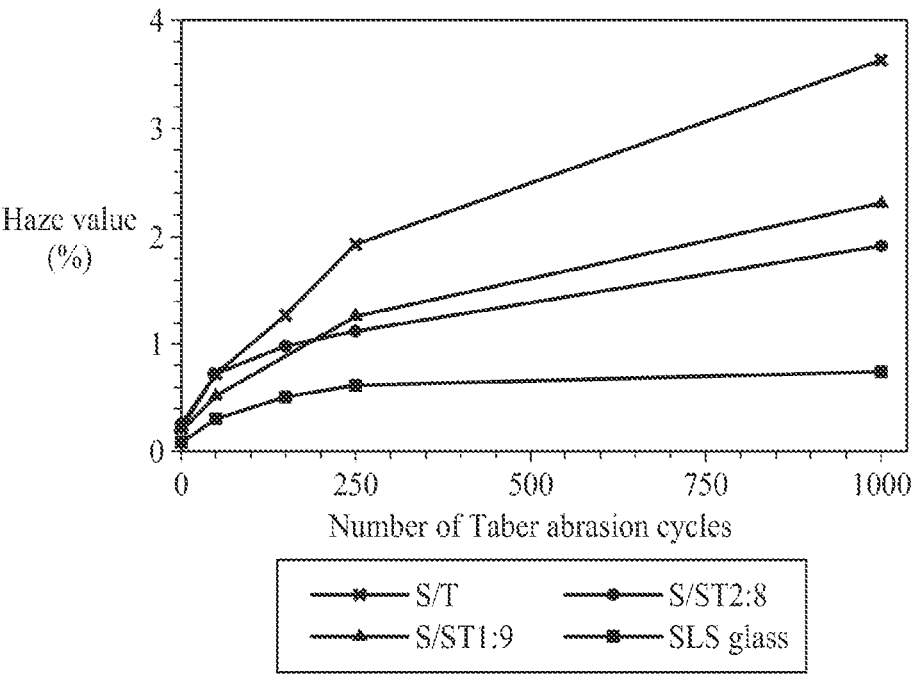
FIGS. 9A and 9B are diagrams for describing a haze characteristic of each of silicon oxide and titanium oxide.
Figure 9B:
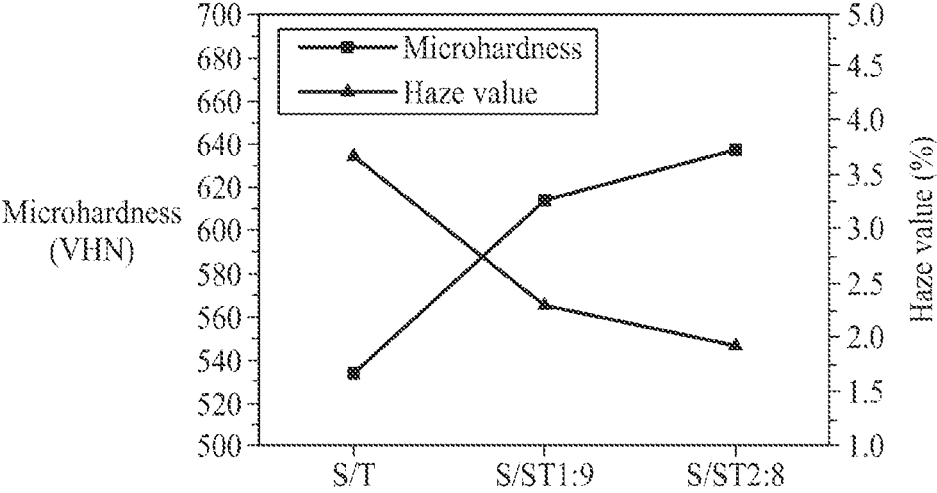

FIGS. 9A and 9B are diagrams for describing a haze characteristic of each of silicon oxide and titanium oxide. In graphs of FIGS. 9A and 9B, S/T represents that a $TiO_2$ thin film is deposited on a substrate (for example, soda-lime glass), S/ST represents that a $SiO_2$ thin film and a $TiO_2$ thin film are deposited on the substrate, and SLS glass represents a haze of the substrate obtained through measurement. In the graph of FIG. 9A, the X axis represents a haze value of each thin film with respect to the number of taber abrasion cycles, and in the graph of FIG. 9B, the X axis represents a haze value (%) and microhardness (VHN) of each thin film.

Referring to FIG. 9A, a haze value has been measured to be higher in a sample (S/ST), where the $SiO_2$ thin film and the $TiO_2$ thin film are deposited on the substrate, than the SLS glass and has been measured to be higher in a sample (S/T), where the $TiO_2$ thin film is deposited on the substrate, than the sample (S/ST) where the $SiO_2$ thin film and the $TiO_2$ thin film are deposited on the substrate. Therefore, the inventors have confirmed that a high haze characteristic is obtained when only the $TiO_2$ thin film is deposited on the substrate. Accordingly, a degradation prevention layer according to an embodiment of the present disclosure may include an inorganic layer including $TiO_2$.

Referring to FIG. 9B, the sample (S/T) where the $TiO_2$ thin film is deposited on the substrate may have a haze value of about 3.5% or more, a sample (S/ST 1:9) where the $SiO_2$ thin film and the $TiO_2$ thin film are deposited on the substrate at a ratio of 1:9 may have a haze value of about 2.25%, and a sample (S/ST 2:8) where the $SiO_2$ thin film and the $TiO_2$ thin film are deposited on the substrate at a ratio of 2:8 may have a haze value of about 1.8%.

Therefore, when only the $TiO_2$ thin film is deposited on the substrate, the inventors have confirmed that a haze characteristic is better than a case where the $SiO_2$ thin film and the $TiO_2$ thin film are stacked on the substrate. Accordingly, a degradation prevention layer according to an embodiment of the present disclosure may include an inorganic layer including $TiO_2$.

Moreover, the sample (S/T) where the $TiO_2$ thin film is deposited on the substrate may have a microhardness (VHN)

of 530, the sample (S/ST 1:9) where the $SiO_2$ thin film and the $TiO_2$ thin film are deposited on the substrate at a ratio of 1:9 may have a microhardness (VHN) of 610, and the sample (S/ST 2:8) where the $SiO_2$ thin film and the $TiO_2$ thin film are deposited on the substrate at a ratio of 2:8 may have a microhardness (VHN) of 640.

Accordingly, when only the $TiO_2$ thin film is deposited on the substrate, the inventors have confirmed that microhardness is lower than a structure where the $SiO_2$ thin film and the $TiO_2$ thin film are deposited on the substrate.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the technical idea or scope of the disclosures. Thus, it is intended that the present disclosure covers the modifications and variations of this disclosure provided they come within the scope of the appended claims and their equivalents.

What is claimed is:

1. A display apparatus comprising:
   a substrate including a display area; and
   a subpixel in the display area,
   wherein the subpixel comprises:
      a driving thin film transistor (TFT) and a switching TFT;
      a first planarization layer configured to cover the driving TFT and the switching TFT;
      a connection electrode on the first planarization layer;
      a second planarization layer configured to cover the connection electrode;
      a light emitting device layer on the second planarization layer and connected to the connection electrode; and
      a degradation prevention layer overlapping the switching TFT,
      wherein each of the driving TFT and the switching TFT comprises a gate electrode, an active layer, a source electrode, and a drain electrode,
      wherein the source electrode and the drain electrode of each of the driving TFT and the switching TFT are disposed on a same layer, and
      wherein the drain electrode of the driving TFT is connected to the connection electrode.

2. The display apparatus of claim 1, wherein the degradation prevention layer overlaps one or more of the gate electrode of the switching TFT, the source electrode of the switching TFT, and the drain electrode of the switching TFT.

3. The display apparatus of claim 2, wherein the degradation prevention layer is disposed to at least partially surround the active layer of the switching TFT.

4. The display apparatus of claim 2, wherein the active layer of the switching TFT includes an oxide semiconductor material.

5. The display apparatus of claim 2, wherein the degradation prevention layer is between the active layer and one or more of the gate electrode of the switching TFT, the source electrode of the switching TFT, and the drain electrode of the switching TFT.

6. The display apparatus of claim 2, wherein the gate electrode of the switching TFT comprises:

a lower gate electrode under the active layer; and an upper gate electrode on the active layer, and wherein the degradation prevention layer overlaps one or more of the lower gate electrode and the upper gate electrode.

7. The display apparatus of claim 6, wherein the degradation prevention layer is between the active layer and the lower gate electrode.

8. The display apparatus of claim 6, wherein the degradation prevention layer is between the active layer and the upper gate electrode.

9. The display apparatus of claim 1, wherein the gate electrode of the switching TFT comprises:

an upper gate electrode overlapping the active layer with an upper gate insulation layer therebetween; and a lower gate electrode overlapping the active layer with a lower interlayer insulation layer therebetween, and wherein the active layer of the switching TFT includes an oxide semiconductor material.

10. The display apparatus of claim 9, wherein the degradation prevention layer comprises a first degradation prevention layer covering the lower gate electrode.

11. The display apparatus of claim 10, wherein the first degradation prevention layer covers all of an upper surface and a lateral surface of the lower gate electrode.

12. The display apparatus of claim 10, wherein a width of the first degradation prevention layer is greater than or equal to a width of the active layer.

13. The display apparatus of claim 10, wherein the first degradation prevention layer overlaps a whole lower surface of the active layer.

14. The display apparatus of claim 9, wherein the degradation prevention layer comprises a second degradation prevention layer contacting a lower surface of the upper gate electrode.

15. The display apparatus of claim 14, wherein the second degradation prevention layer overlaps a whole lower surface of the upper gate electrode.

16. The display apparatus of claim 9, wherein the degradation prevention layer comprises:

a third degradation prevention layer under the source electrode of the switching TFT; and a fourth degradation prevention layer under the drain electrode of the switching TFT.

17. The display apparatus of claim 16, wherein the third degradation prevention layer is not provided in a contact region where the source electrode of the switching TFT contacts the active layer.

18. The display apparatus of claim 16, wherein the fourth degradation prevention layer is not provided in a contact region where the drain electrode of the switching TFT contacts the active layer.

19. The display apparatus of claim 16, wherein the degradation prevention layer comprises a fifth degradation prevention layer under the connection electrode.

20. The display apparatus of claim 19, wherein a width of the fifth degradation prevention layer is greater than or equal to a width of a lower surface of the connection electrode.

21. The display apparatus of claim 19, wherein the fifth degradation prevention layer is not provided in a contact region where the drain electrode of the switching TFT contacts the connection electrode.

22. The display apparatus of claim 1, wherein the degradation prevention layer comprises an inorganic layer, and a thickness of the degradation prevention layer is 10 nm to 15 nm.

23. The display apparatus of claim 22, wherein the inorganic layer comprises a titanium oxide film or an aluminum oxide film.

24. The display apparatus of claim 1, wherein the driving TFT is connected in a diode structure while the switching TFT is turned on.

25. The display apparatus of claim 1, further comprising:

a light blocking layer under the active layer of the driving TFT and overlapped with the active layer of the driving TFT.

26. The display apparatus of claim 25, wherein the light blocking layer comprises a metal material including titanium.

27. The display apparatus of claim 1, further comprising:

an encapsulation layer on the light emitting device layer;

a touch buffer layer on the encapsulation layer;

a touch sensor layer on the touch buffer layer and including touch electrodes; and a touch planarization layer configured to cover the touch sensor layer.

* * * * *